(12) United States Patent
Hirotani et al.

(10) Patent No.: US 11,404,291 B2
(45) Date of Patent: Aug. 2, 2022

(54) SUBSTRATE PROCESSING APPARATUS AND METHOD OF MANUFACTURING SEMICONDUCTOR DEVICE

(71) Applicant: Kokusai Electric Corporation, Tokyo (JP)

(72) Inventors: Hiroshi Hirotani, Toyama (JP); Nobuhito Takata, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 21 days.

(21) Appl. No.: 16/913,588

(22) Filed: Jun. 26, 2020

(65) Prior Publication Data
US 2020/0411335 A1    Dec. 31, 2020

(30) Foreign Application Priority Data
Jun. 28, 2019  (JP) .............................. JP2019-121536

(51) Int. Cl.
*H01L 21/67*  (2006.01)
*H01L 21/677* (2006.01)
*H01L 21/673* (2006.01)

(52) U.S. Cl.
CPC .. *H01L 21/67017* (2013.01); *H01L 21/67196* (2013.01); *H01L 21/67745* (2013.01);
(Continued)

(58) Field of Classification Search
None
See application file for complete search history.

(56) References Cited

U.S. PATENT DOCUMENTS

| 5,221,201 A | 6/1993 | Yamaga et al. |
| 2011/0305543 A1 | 12/2011 | Nakashima et al. |

(Continued)

FOREIGN PATENT DOCUMENTS

| JP | 2000-286175 A | 10/2000 |
| JP | 2002-175999 A | 6/2002 |

(Continued)

OTHER PUBLICATIONS

Office Action in corresponding Singapore Patent Application No. 10202006103P, dated Apr. 27, 2021.
(Continued)

*Primary Examiner* — Ronald P Jarrett
(74) *Attorney, Agent, or Firm* — Edell, Shapiro & Finnan, LLC

(57) ABSTRACT

Described herein is a technique capable of suppressing generation of particles and improving a throughput. According to one aspect of the technique, there is provided a substrate processing apparatus including: a loading chamber accommodating a boat; an elevator configured to elevate and lower the boat; a boat exchanging device configured move the boat on the elevator to a first stand-by region and a second stand-by region; a first clean air supplier facing an unloading region in the loading chamber where the boat placed on the elevator is accommodated; a second clean air supplier facing the first stand-by region; and a third clean air supplier facing the second stand-by region, wherein a flow volume ejected from the clean air suppliers are individually controlled so as to form a predetermined air flow in a range of height in which the boat exchanging device in the loading chamber is provided.

11 Claims, 11 Drawing Sheets

(52) U.S. Cl.
    CPC .. *H01L 21/67313* (2013.01); *H01L 21/67754* (2013.01); *H01L 21/67757* (2013.01)

(56) References Cited

U.S. PATENT DOCUMENTS

| | | |
|---|---|---|
| 2012/0083120 A1 | 4/2012 | Nakada et al. |
| 2016/0268153 A1* | 9/2016 | Wada .................. B65G 49/065 |
| 2017/0218513 A1 | 8/2017 | Nakada et al. |

FOREIGN PATENT DOCUMENTS

| | | |
|---|---|---|
| JP | 2003-332325 A | 11/2003 |
| JP | 2008-117868 A | 5/2008 |
| JP | 2008-141176 A | 6/2008 |
| JP | 2012-79907 A | 4/2012 |
| JP | 2012-094805 A | 5/2012 |
| JP | 2015-167240 A | 9/2015 |
| KR | 10-2012-0034551 A | 4/2012 |

OTHER PUBLICATIONS

Office Action in corresponding Japanese Patent Application No. 2019-121536, dated Jul. 13, 2021, with English translation.
Office Action in corresponding Korean Patent Application No. 10-2020-0076895, dated Aug. 28, 2021, with English translation.

\* cited by examiner

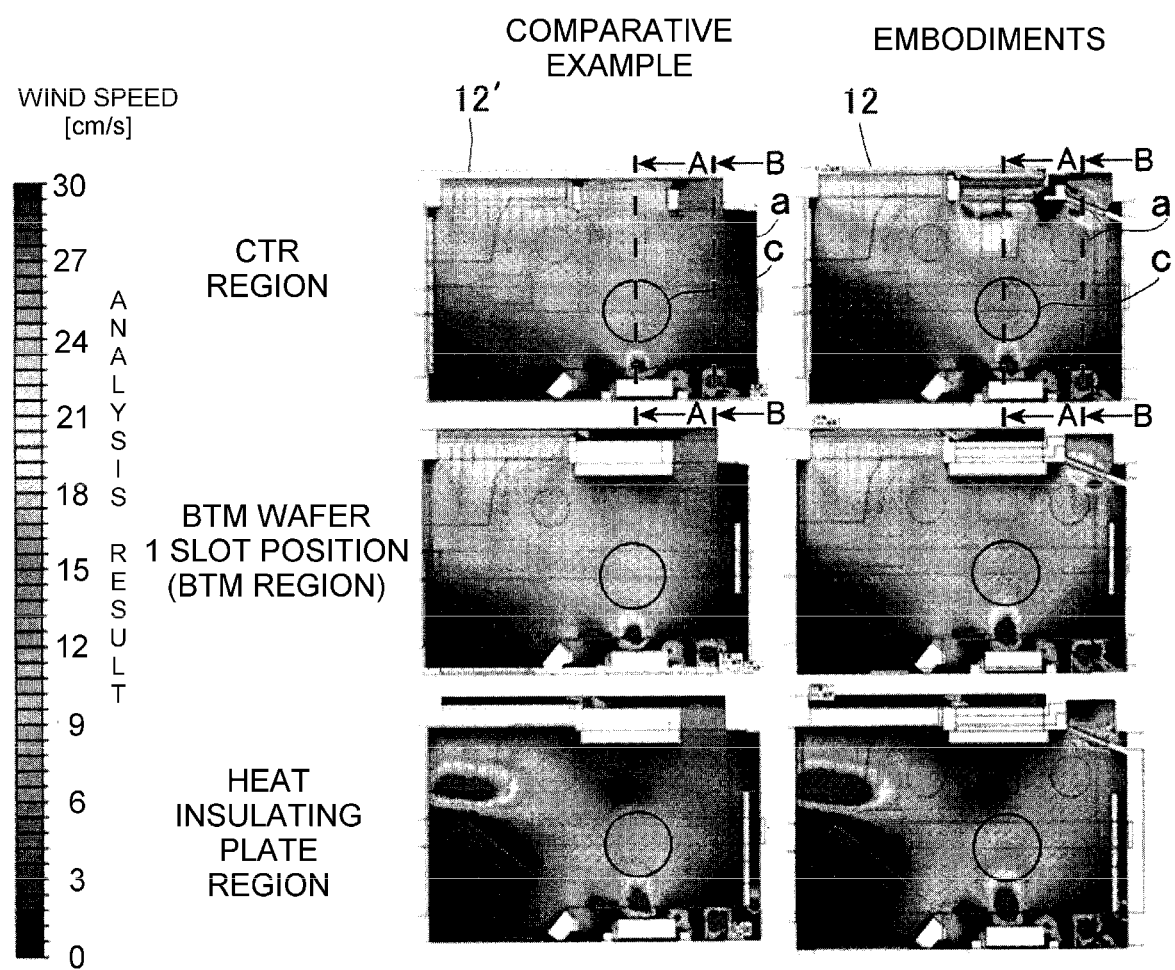

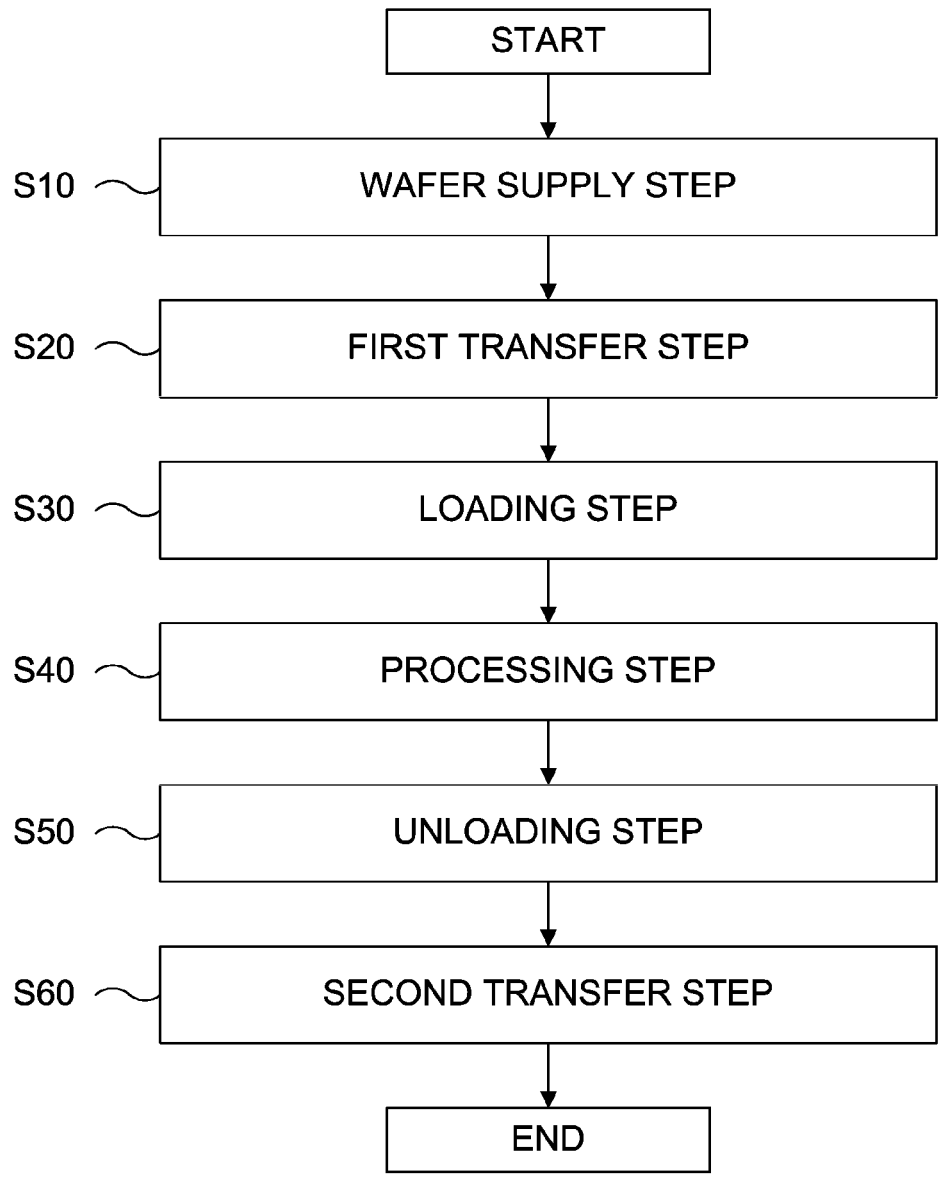

SUBSTRATE PROCESSING APPARATUS AND METHOD OF MANUFACTURING SEMICONDUCTOR DEVICE

CROSS REFERENCE TO RELATED APPLICATIONS

This application claims foreign priority under 35 U.S.C. § 119(a)-(d) to Application No. JP 2019-121536 filed on Jun. 28, 2019, the entire contents of which are hereby incorporated by reference.

TECHNICAL FIELD

The present disclosure relates to a substrate processing apparatus configured to perform a heat treatment process such as a film-forming process, an oxidation process, a diffusion process, a CVD process and an annealing process on a substrate such as a silicon wafer, and a method of manufacturing a semiconductor device.

BACKGROUND

As an apparatus (hereinafter, also referred to as a "substrate processing apparatus") of forming an oxide film or a metal film on a substrate (hereinafter, also referred to as a "wafer") in manufacturing processes of a semiconductor device, a vertical type substrate processing apparatus may be used. In addition, as the substrate processing apparatus, a two-boat type substrate processing apparatus may be used. According to the two-boat type substrate processing apparatus, two boats configured to accommodate wafers including the wafer are used, and the two boats are alternately loaded into a process chamber of the substrate processing apparatus or unloaded out of the process chamber in order to improve a throughput of the substrate processing apparatus.

A clean air supply mechanism configured to eject clean air may be provided at the substrate processing apparatus in order to cool processed wafers including the wafer or to remove particles. However, according to the two-boat type substrate processing apparatus, since it is necessary to install a boat exchange device configured to exchange the two boats, a shape of the two-boat type substrate processing apparatus may be limited such that the clean air supply mechanism and a fan mechanism provided on a back surface of the clean air supply mechanism do not interfere with the boat exchanging device.

Therefore, it may be difficult to secure a sufficient flow volume of the clean air. In addition, since the clean air may stagnate at a location such as a lower portion of the substrate processing apparatus, a portion in the vicinity of the boat exchanging device and a wafer cooling position of the boat exchanging apparatus, the particles may not be removed sufficiently. In addition, unless a flow of the clean air is reliably formed in the vicinity of a boat elevator configured to elevate or lower the boat, the wafer may not be cooled uniformly. As a result, the throughput may be decreased and a quality of the semiconductor device may be decreased due to the generation of the particles.

SUMMARY

Described herein is a technique capable of suppressing generation of particles and improving a throughput.

According to one aspect of the technique of the present disclosure, there is provided a substrate processing apparatus including: a loading chamber communicating with a process chamber where a substrate is processed and capable of accommodating two or more boats including a boat supporting a plurality of substrates including the substrate; an elevator configured to elevate and lower the boat between the process chamber and the loading chamber; a boat exchanging device configured move the boat unloaded out of the process chamber and placed on the elevator to a first stand-by region and a second stand-by region; a first clean air supplier configured to eject clean air in a first direction and facing an unloading region in the loading chamber where the boat placed on the elevator is accommodated; a second clean air supplier configured to eject the clean air in a second direction and facing the first stand-by region; and a third clean air supplier configured to eject the clean air in a third direction and facing the second stand-by region, wherein an flow volume of the clean air ejected from each of the first clean air supplier, the second clean air supplier and the third clean air supplier is individually controlled so as to form a predetermined air flow in a range of height in which the boat exchanging device in the loading chamber is provided.

BRIEF DESCRIPTION OF THE DRAWINGS

FIG. 8A schematically illustrates wind speed distributions at predetermined heights in the loading chamber according to the comparative example, and FIG. 8B schematically illustrates wind speed distributions at the predetermined heights in the loading chamber according to the embodiments described herein.

FIG. 11 is a flow chart schematically illustrating a substrate processing according the embodiments described herein.

DETAILED DESCRIPTION

Hereinafter, one or more embodiments (also simply referred to as "embodiments") according to the technique of the present disclosure will be described with reference to the drawings.

First, a substrate processing apparatus according to the embodiments will be briefly described.

For example, the substrate processing apparatus according to the embodiments is used in manufacturing processes of a semiconductor device, and is configured to perform a substrate processing by heating a substrate by a heater while the substrate to be processed is accommodated in a process chamber of the substrate processing apparatus. More specifically, a vertical type substrate processing apparatus configured to simultaneously process a plurality of substrates (also simply referred to as "substrates") stacked in a vertical direction at predetermined intervals may be used as the substrate processing apparatus.

As the substrate to be processed by the substrate processing apparatus, a semiconductor wafer substrate (hereinafter simply referred to as "wafer") on which a semiconductor integrated circuit device (that is, the semiconductor device) is formed may be used. As the substrate processing, a process such as an oxidation process, a diffusion process, an annealing process of removing defects or activating carriers after performing an ion implantation process, and a film-forming process by a thermal CVD (Chemical Vapor Deposition) reaction may be performed.

Hereinafter, an exemplary configuration of the substrate processing apparatus according to the embodiments will be described.

Figure 1:
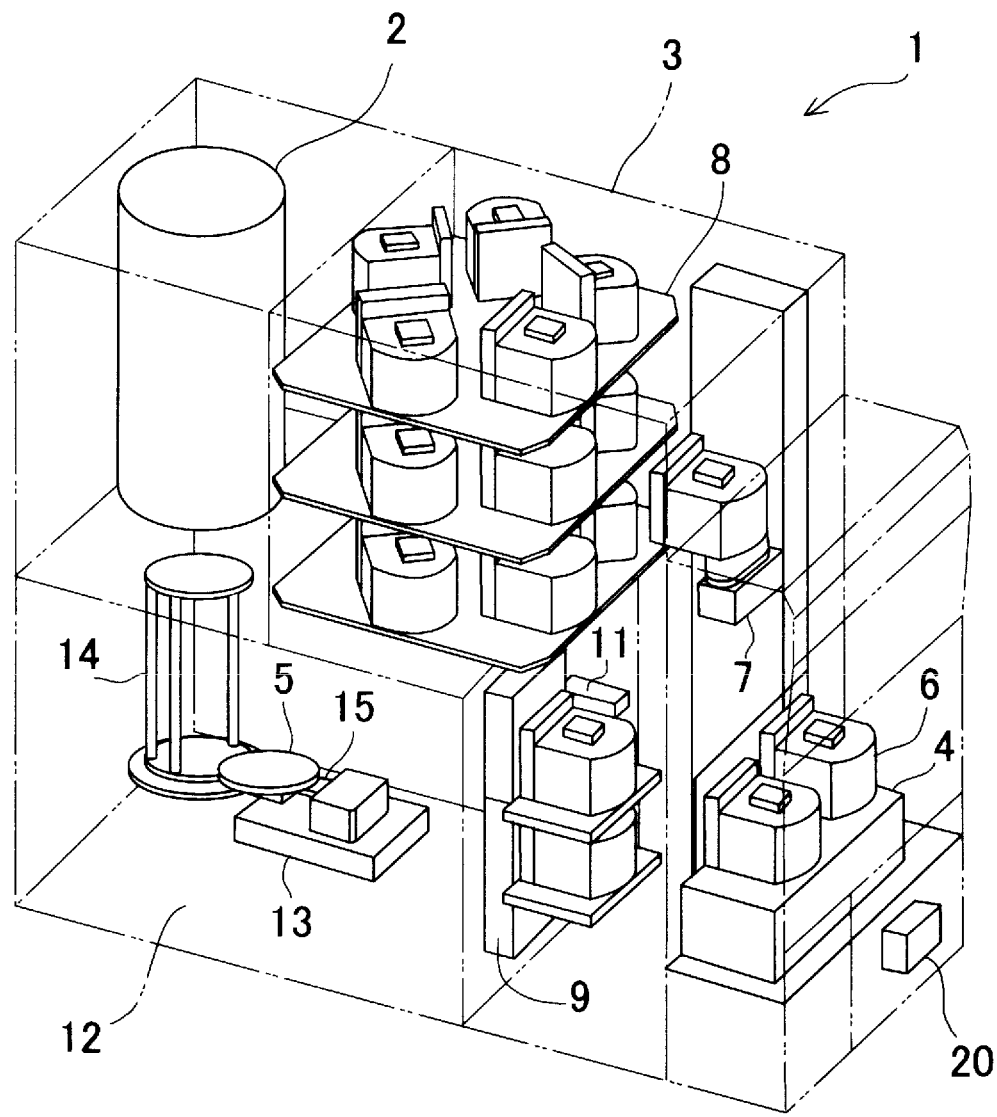
FIG. 1 is a perspective view schematically illustrating a substrate processing apparatus according to one or more embodiments described herein and in common with prior art.

FIG. 1 is a perspective view schematically illustrating the exemplary configuration of the substrate processing apparatus according to the embodiments. A substrate processing apparatus 1 according to the embodiments includes a housing 3 in which main components of the substrate processing apparatus 1 such as a process furnace 2 are provided. A pod stage 4 is provided at a front side of the housing 3. A FOUP (Front Open Unified Pod) 6 serving as a substrate container configured to accommodate a wafer 5 may be transferred and placed on the pod stage 4. Hereinafter, the FOUP 6 is also referred to as a pod 6. For example, 25 wafers including the wafer 5 may be accommodated in the pod 6, and the pod 6 may be placed on the pod stage 4 with a cap (not shown) thereof closed. That is, the pod 6 is used as a wafer carrier in the substrate processing apparatus 1.

A pod transport device 7 is provided at a front side in the housing 3 opposite to the pod stage 4. A pod shelf 8, a pod opener 9 and a substrate number detector 11 are provided in the vicinity of the pod transport device 7.

The pod transport device 7 is configured to transfer the pod 6 between the pod stage 4 and the pod shelf 8. The pod shelf 8 is provided above the pod opener 9, and is configured to support a plurality of pods (also simply referred to as "pods") including the pod 6 while the pods are placed thereon. The pod shelf 8 may be constituted by a so-called rotary shelf which has rotatable shelf plates. The rotatable shelf plates may be driven by a driving mechanism (not shown). The pod opener 9 is configured to open the cap of the pod 6 so as to communicate an inside of the pod 6 with a loading chamber 12 described later. The substrate number detector 11 is provided in the vicinity of the pod opener 9, and is configured to detect the number of the wafers including the wafer 5 in the pod 6 with the cap of the pod 6 opened.

The loading chamber 12, which is defined as a room in the housing 3, is provided closer to a rear side in the housing 3 than the pod opener 9. The loading chamber 12 will be described later in detail.

A substrate transport device 13 and a boat 14 serving as a substrate retainer are provided in the loading chamber 12. The substrate transport device 13 is provided with an end effector (tweezers) 15 capable of moving the wafer 5 horizontally. By moving the end effector 15 up and down and/or rotating the end effector 15 by a driving device (not shown), the wafer 5 is transferred between the boat 14 and the pod 6 placed at a position corresponding to the pod opener 9.

The boat 14 is configured to support, for example, 50 to 150 wafers including the wafer 5 in a horizontal manner in multiple stages. Specifically, the boat 14 supports the wafers while the wafers are horizontally oriented with their centers aligned with each other. That is, the boat 14 supports (accommodates) the wafers with predetermined intervals therebetween. The boat 14 charged with the wafers including the wafer 5 therein may be elevated or lowered by a boat elevator 16 described later serving as an elevating mechanism. A heat insulating part (also referred to as a "heat insulating portion") 14a is provided at a lower portion of the boat 14. For example, the heat insulating part 14a is of a cylindrical shape, and is made of a heat resistant material such as silicon (Si) and silicon carbide (SiC). Alternatively, instead of the heat insulating part 14a, a predetermined number of heat insulating plates having the same shape as the wafer 5 made of a heat resistant material such as Si and SiC may be loaded in the boat 14.

The process furnace 2 is provided at an upper portion of the rear side of the housing 3, that is, above the loading chamber 12. The boat 14 charged with the wafers including the wafer 5 therein may be loaded into the process furnace 2 through a lower end opening of the process furnace 2.

Figure 2:
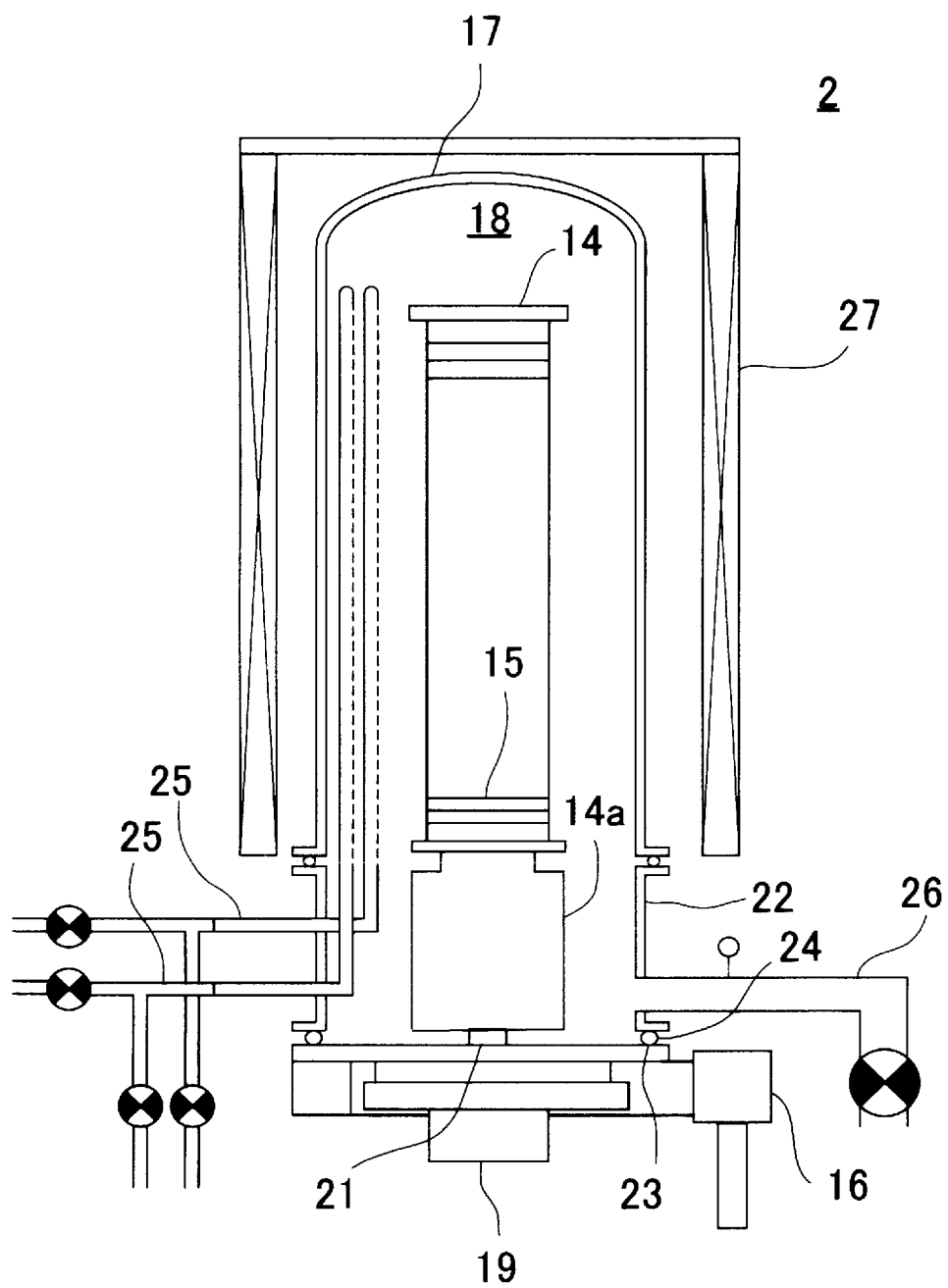
FIG. 2 schematically illustrates a vertical cross-section of a process furnace of the substrate processing apparatus according to the embodiments described herein FIG. 2 schematically illustrates a vertical cross-section of a process furnace of the substrate processing apparatus according to the embodiments described herein and in common with prior art.

Subsequently, the process furnace 2 will be described. FIG. 2 schematically illustrates an exemplary configuration of the process furnace 2 of the substrate processing apparatus 1 according to the embodiments.

The process furnace 2 includes a reaction tube 17. The reaction tube 17 is made of a heat resistant non-metallic material such as quartz ($SiO_2$) and silicon carbide (SiC). The reaction tube 17 is of a cylindrical shape with a closed upper end and an open lower end.

A process chamber 18 is defined by an inside of the reaction tube 17. The boat 14 serving as a substrate retainer is loaded (inserted) into the process chamber 18 through the lower end opening of the process furnace 2. The wafers including the wafer 5 supported by the boat 14 are accommodated in the process chamber 18 in multiple stages vertically. By rotating a rotation shaft 21 by a rotating mechanism 19, the boat 14 accommodated in the process chamber 18 and supporting the wafers may be rotated while maintaining the process chamber 18 airtight (hermetically sealed).

A manifold 22 is provided under the reaction tube 17 so as to be concentric with the reaction tube 17. For example, the manifold 22 is made of a metal such as stainless steel (SUS), and is of a cylindrical shape with open upper and lower ends. The reaction tube 17 is vertically supported from the lower end thereof by the manifold 22. That is, the process furnace 2 is constituted by the reaction tube 17 defining the process chamber 18 and vertically supported via the manifold 22.

When the boat elevator 16 elevates the boat 14 into the process chamber 18, the lower end of the manifold 22 is hermetically sealed by a seal cap 23. A sealing part 24 such as an O-ring configured to hermetically seal the process chamber 18 is provided between the lower end of the manifold 22 and the seal cap 23. A gas introduction pipe 25 configured to introduce a gas such as a source gas and a purge gas into the process chamber 18 and an exhaust pipe 26 configured to exhaust the gas in the process chamber 18 are connected to the manifold 22, respectively.

A heater mechanism (also simply referred to as a "heater") 27 serving as a heating apparatus (heating device) is provided at an outer periphery of the reaction tube 17 so as to be concentric with the reaction tube 17. The heater mechanism 27 is configured to heat an inner atmosphere of the process chamber 18 so that an inner temperature of the process chamber 18 has a predetermined temperature distribution including a soaking region.

Figure 10:
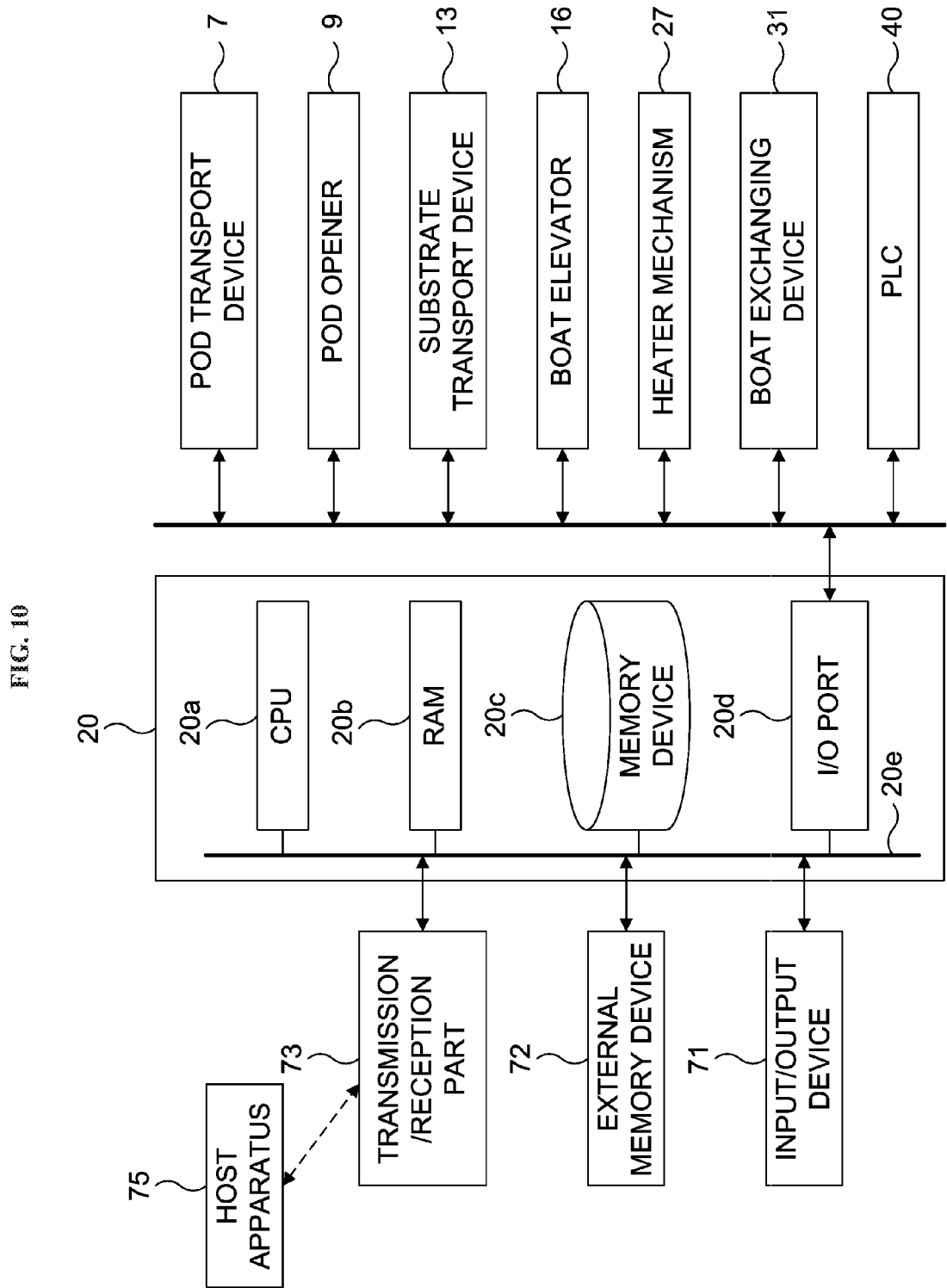
FIG. 10 is a functional block diagram schematically illustrating a configuration of a controller and related components of the substrate processing apparatus according to the embodiments described herein.

A controller 20 configured to control operations of the substrate processing apparatus 1 may be provided at a lower portion of the front side of the housing 3. FIG. 10 schematically illustrates a configuration of the controller 20 and related components of the substrate processing apparatus 1. The controller 20 serving as a control device (control mechanism) may be embodied by a computer having a CPU (Central Processing Unit) 20a, a RAM (Random Access Memory) 20b, a memory device 20c and an I/O port 20d. The RAM 20b, the memory device 20c and the I/O port 20d may exchange data with the CPU 20a via an internal bus 20e. An input/output device 71 such as a touch panel and an external memory device 72 may be connected to the controller 20. In addition, a transmission/reception part 73 connected to a host apparatus 75 via a network may be provided.

The I/O port 20d is connected to each component of the substrate processing apparatus 1 such as the boat elevator 16, a boat exchanging device 31 which will be described later and a PLC (Programmable Logic Controller) 40. The I/O port 20d may be used to instruct each component of the substrate processing apparatus 1 to perform an operation, or to acquire a state of each component of the substrate processing apparatus 1.

The memory device 20c may be embodied by components such as a flash memory and a HDD (Hard Disk Drive). For example, a control program for controlling the operations of the substrate processing apparatus 1; a process recipe in which information such as the sequences and the conditions of a substrate processing described later is stored; and a maintenance recipe are readably stored in the memory device 20c. Recipes such as the process recipe and the maintenance recipe may be executed by the controller 20 in accordance with a command from the host apparatus 75 as a trigger. These recipes are combined to obtain a predetermined result by performing the sequences of the substrate processing, and serve as a program.

The PLC 40 is configured to receive information (also referred to as "state information") indicating a state in accordance with the progress of the recipe such as the process recipe from the controller 20, and to variably control an flow volume (that is, an amount per unit time) of each of clean air supply mechanisms described later according to the state information.

Hereinafter, the substrate processing according to the embodiments will be described with reference to FIG. 11.

FIG. 11 is a flow chart schematically illustrating a substrate processing according the embodiments described herein. The substrate processing according to the embodiments may be performed as one of manufacturing processes of a semiconductor device. In the following description, operations of the components constituting the substrate processing apparatus 1 are controlled by the controller 20.

Wafer Supply Step S10

When the wafers including the wafer 5 are processed by the substrate processing apparatus 1, first, the pod 6 accommodating a plurality of wafers (simply referred to as "wafers") including the wafer 5 is placed on the pod stage 4. Then, the pod 6 is transferred from the pod stage 4 onto the pod shelf 8 by the pod transport device 7. Further, the pod 6 placed on the pod shelf 8 is transferred to the pod opener 9 by the pod transport device 7. Then, the cap of the pod 6 is opened by the pod opener 9, and the number of the wafers including the wafer 5 accommodated in the pod 6 is detected by the substrate number detector 11.

First Transfer Step S20

After the cap of the pod 6 is opened by the pod opener 9, the wafers including the wafer 5 are transported out of the pod 6 by the substrate transport device 13 provided in the loading chamber 12. Then, the unprocessed wafers including the wafer 5 are transferred (charged) into the boat 14 provided in the loading chamber 12 by the substrate transport device 13. That is, the substrate transport device 13 performs a wafer charging operation of transferring the unprocessed wafers into the boat 14 and accommodating the unprocessed wafers in the boat 14 before the boat 14 provided in the loading chamber 12 is transferred (loaded) into the process chamber 18. As a result, the boat 14 supports (accommodates) the wafers including the wafer 5 in multiple stages in which the wafers are vertically spaced from each other. For example, the number of the wafers that can be accommodated in multiple stages in the boat 14 and collectively processed may be 25 to 100. Therefore, it is possible to improve the mass productivity.

Loading Step S30

After the wafer charging operation is completed, the boat 14 charged with the unprocessed wafers therein is elevated by an elevating/lowering operation of the boat elevator 16 and is loaded (transferred) into the process chamber 18 (boat loading step). That is, by operating the boat elevator 16, the boat 14 charged with the unprocessed wafers therein is loaded from the loading chamber 12 into the process chamber 18. With the boat 14 loaded, the seal cap 23 seals the lower end of the manifold 22 via the sealing part 24.

Processing Step S40

After the boat 14 is loaded, a predetermined processing is performed on the unprocessed wafers including the wafer 5 supported by the boat 14 loaded into the process chamber 18. Specifically, for example, when a film-forming process by a thermal CVD reaction is performed, the inner atmosphere of the process chamber 18 is exhausted through the exhaust pipe 26 such that an inner pressure of the process chamber 18 reaches a desired pressure (vacuum degree). The inner atmosphere of the process chamber 18 is heated by the heater mechanism 27, and the boat 14 is rotated by operating the rotating mechanism 19. Thereby, the wafers accommodated in the boat 14 are also rotated. The rotating mechanism 19 continuously rotates the boat 14 (and the wafers) until the boat 14 is unloaded out of the process chamber 18. The gas such as the source gas and the purge gas is supplied into the process chamber 18 through the gas introduction pipe 25. As a result, a film is formed on a surface of the wafer 5 supported by the boat 14 by using a thermal decomposition reaction or a chemical reaction.

After the film is formed on the surface of the wafer 5, the heating by the heater mechanism 27 is stopped, and temperatures of the processed wafers including the wafer 5 are lowered to a predetermined temperature. Then, after a predetermined time has elapsed, the supply of the gas into the process chamber 18 is stopped, and an inert gas is supplied into the process chamber 18. As a result, the inner atmosphere of the process chamber 18 is replaced with the inert gas, and the inner pressure of the process chamber 18 is returned to the atmospheric pressure.

Unloading Step S50

Thereafter, the seal cap 23 is lowered by the elevating/lowering operation of the boat elevator 16, and the lower end of the manifold 22 is opened. The boat 14 with the processed wafers including the wafer 5 charged therein is transferred (unloaded) out of the process chamber 18 through the lower end of the manifold 22 (boat unloading step). That is, by operating the boat elevator 16, the boat 14 with the processed wafers including the wafer 5 charged therein is unloaded from the process chamber 18 into the loading chamber 12. Then, the boat 14 stands by at a predetermined position until all the processed wafers supported by the boat 14 are cooled.

Second Transfer Step S60

After the processed wafers including the wafer 5 in the boat 14 are cooled to a predetermined temperature (for example, about room temperature), the processed wafers are transported out of the boat 14 by the substrate transport device 13 provided in the loading chamber 12. Then, the processed wafers transported out of the boat 14 are transferred to and accommodated in the pod 6 placed on the pod opener 9. That is, the substrate transport device 13 performs a wafer discharging operation of transferring the processed wafers from the boat 14 in the loading chamber 12 to the pod 6.

After the processed wafers are accommodated in the pod 6, the pod 6 with the processed wafers including the wafer 5 is transferred to the pod shelf 8 or the pod stage 4. Thereby, the substrate processing by the substrate processing apparatus 1 according to the embodiments is completed.

Subsequently, a configuration inside the loading chamber 12, which is a characteristic configuration of the substrate processing apparatus 1 according to the embodiments, will be described in detail. For example, the configuration inside the loading chamber 12 will be described by way of an example in which two boats such as a first boat and a second boat serving as the boat 14 are alternately loaded into and unloaded out of the process chamber 18 in order to increase the throughput. Hereinafter, the first boat and the second boat may be collectively referred to as the two boats 14, or may be individually referred to as the boat 14. Hereinafter, the loading chamber 12 of a so-called two-boat type apparatus will be described.

Figure 3:
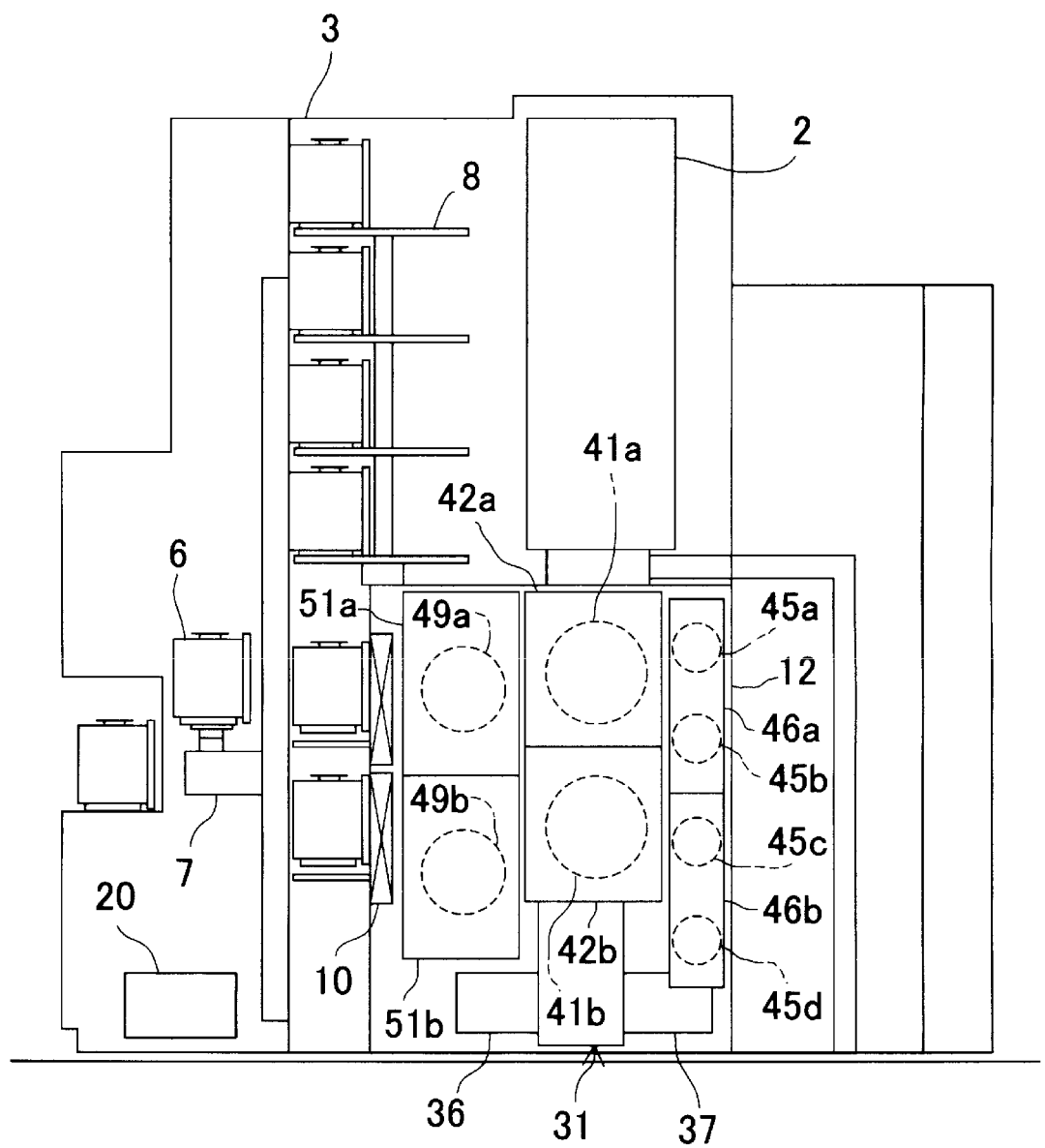
FIG. 3 schematically illustrates a vertical cross-section of the substrate processing apparatus according to the embodiments described herein.
Figure 4:
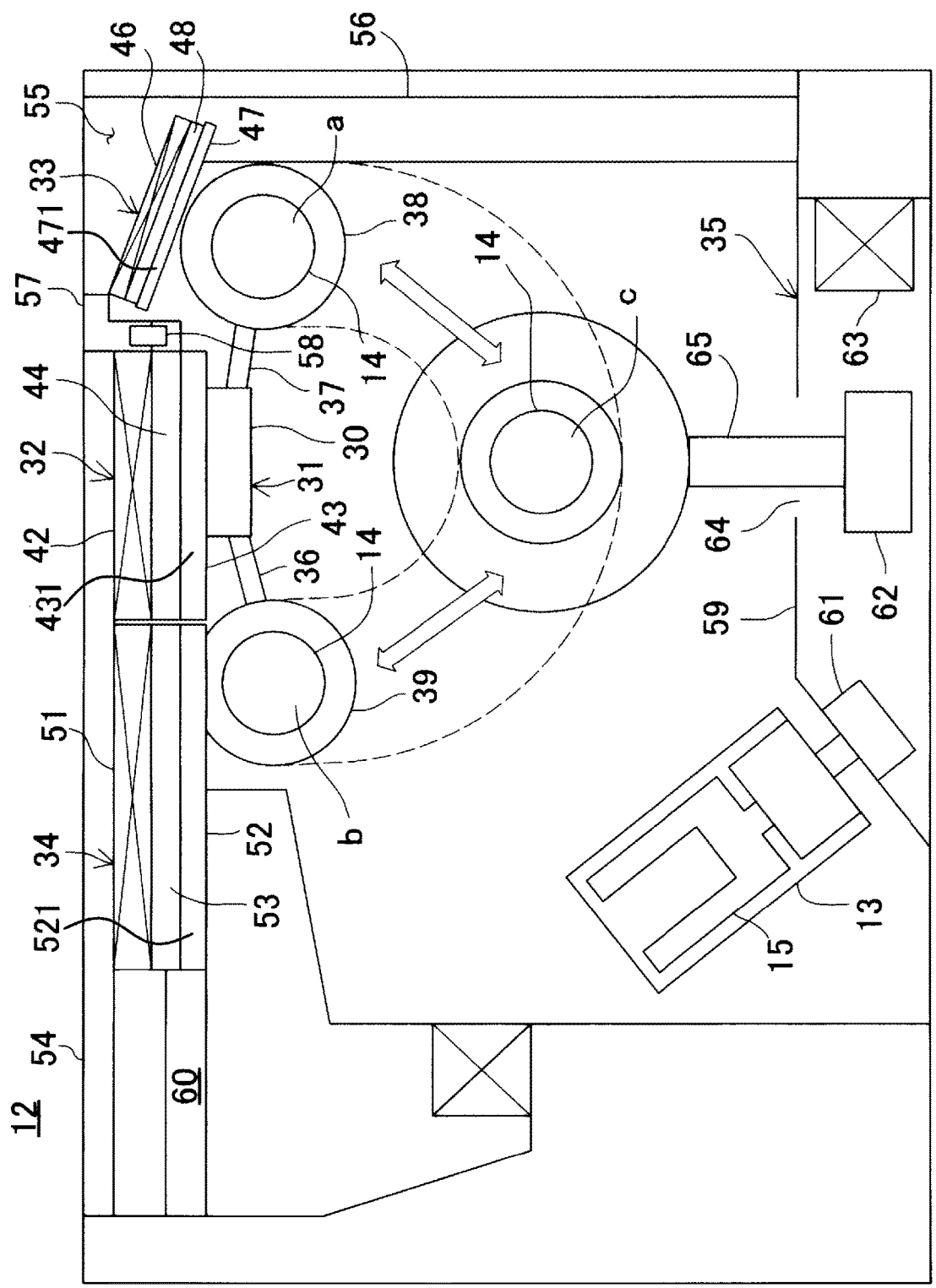
FIG. 4 is a plan view schematically illustrating a loading chamber of the substrate processing apparatus according to the embodiments described herein.

FIG. 3 schematically illustrates a vertical cross-section of the substrate processing apparatus 1 according to the embodiments, and FIG. 4 schematically illustrates the loading chamber 12 of the substrate processing apparatus 1 according to the embodiments when viewed from above. As described above, the substrate processing apparatus 1 includes the loading chamber 12 in which the wafer charging operation of transferring the unprocessed wafers into the boat 14 and accommodating the unprocessed wafers in the boat 14 and the wafer discharging operation of transferring the processed wafers from the boat 14 in the loading chamber 12 to the pod 6 are performed. The loading chamber 12 is partitioned and provided as a single room of a planar rectangular shape including a ceiling, a floor, and side surfaces surrounding four sides of the room. That is, the loading chamber 12 includes a substantially rectangular internal space. However, the loading chamber 12 is not limited to the planar rectangular shape. For example, the loading chamber 12 may be of a planar polygonal shape such as a planar triangular shape and a planar pentagonal shape. According to the embodiments, a component such as a load lock chamber and a nitrogen purge box may not be provided in the loading chamber 12, and an inner atmosphere of the loading chamber 12 may be an air atmosphere.

A wafer loading/unloading port 10 is provided on a side surface (front surface) of the loading chamber 12 where the pod opener 9 is provided. The wafer 5 is transferred through the wafer loading/unloading port 10 between the pod 6 placed at the position of the pod opener 9 and the boat 14 in the loading chamber 12. The wafer loading/unloading port 10 is configured to be opened or closed by a door (not shown). In addition, a communication port (not shown) is provided at the ceiling of the loading chamber 12. A shape and a size of the communication port may be set such that the boat 14 accommodating the wafers including the wafer 5 can pass through the communication port.

The substrate transport device 13, the boat 14, the boat elevator 16, the boat exchanging device 31, a first clean air supply mechanism (also referred to as a "first clean air supplier" or "fan filter unit") 32, a second clean air supply mechanism (also referred to as a "second clean air supplier") 33, a third clean air supply mechanism (also referred to as a "third clean air supplier") 34 and an exhaust part (also referred to as an "exhaust mechanism") 35 are arranged in the loading chamber 12 described above.

Figure 5:
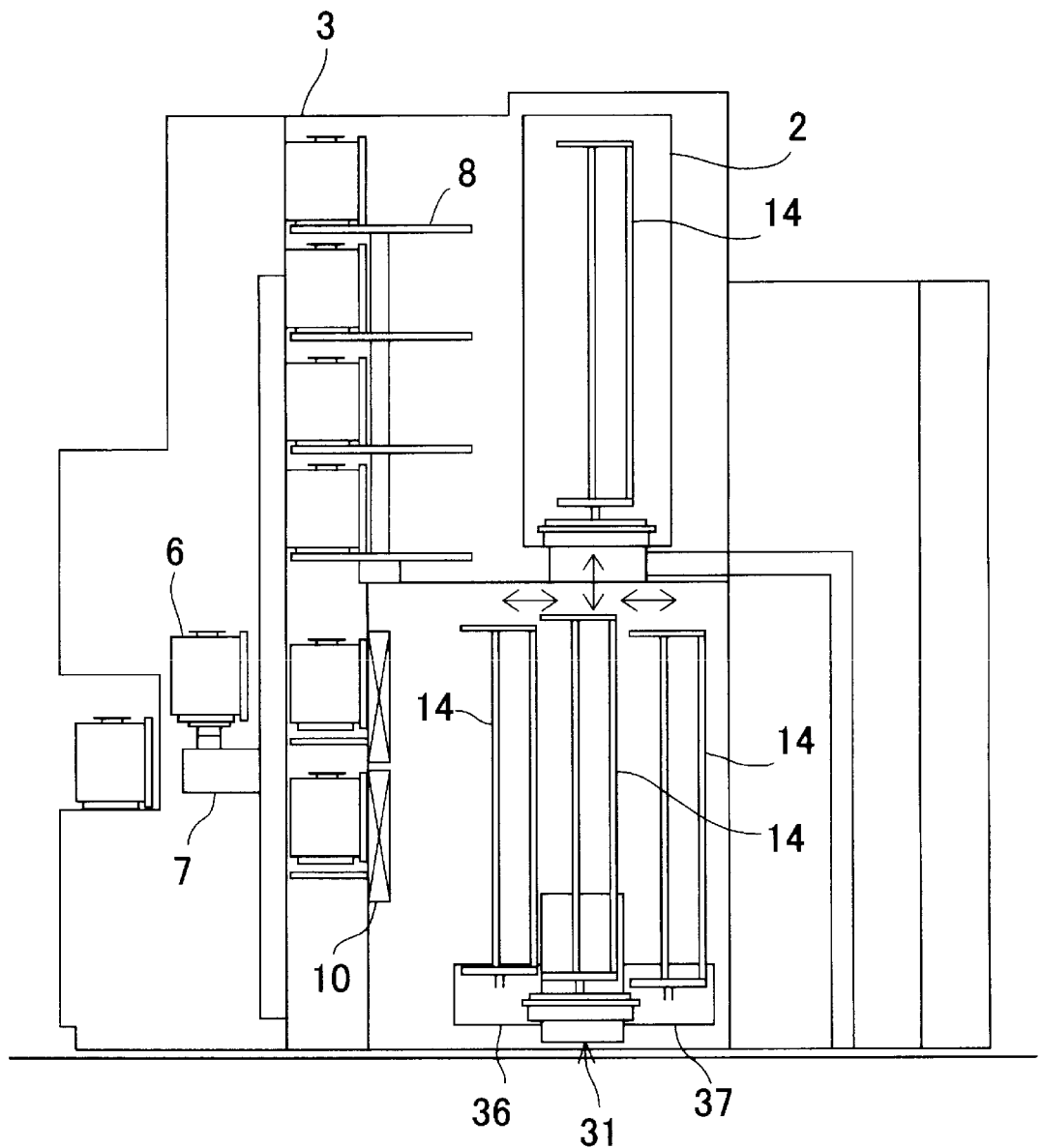
FIG. 5 schematically illustrates an arrangement of substrate retainers of the substrate processing apparatus according to the embodiments described herein.

Hereinafter, the boat exchanging device 31 will be described with reference to FIGS. 4 and 5. In FIG. 5, the illustration of the first clean air supply mechanism 32, the second clean air supply mechanism 33 and the third clean air supply mechanism 34 is omitted for convenience. According to the two-boat type apparatus using the two boats 14, the boat exchanging device 31 is provided in the loading chamber 12 in order to alternately load the two boats 14 into the process chamber 18 or to unload out of the process chamber 18.

The boat exchanging device 31 includes a device body 30, a first arm 36 and a second arm 37. The boat exchanging device 31 is provided at a position facing the boat elevator 16 provided along a second side surface adjacent to the front surface of the loading chamber 12.

The first arm 36 and the second arm 37 may be rotated independently in a horizontal direction around rotation shafts (not shown) concentrically provided at the device body 30, and may also be elevated and lowered independently. The two rotation shafts of the boat exchanging device 31 are provided below the first clean air supply mechanism 32 close to a first side surface described later. The boat exchange device 31 may transfer and support the boat 14 among a boat cooling position (also referred to as a "first stand-by region") (indicated by "a" in FIG. 4) located at a right end of an arc shown in FIG. 4, a wafer transfer position (also referred to as a "second stand-by region") (indicated by "b" in FIG. 4) located at a left end of the arc shown in FIG. 4, and a boat loading/unloading position (also referred to as a "unloading region") (indicated by "c" in FIG. 4) located at a center of the arc shown in FIG. 4. Hereinafter, the boat cooling position is also referred to as the boat cooling position "a", the wafer transfer position is also referred to as the wafer transfer position "b", and the boat loading/unloading position is also referred to as the boat loading/unloading position "c". A boat placing table 38 and a boat placing table 39 are provided at the boat cooling position "a" and the wafer transfer position "b", respectively. The wafers accommodated in the boat 14 are being cooled while the boat 14 is placed on the boat placing table 38, and the wafers accommodated in the boat 14 are being transferred while the boat 14 is placed on the boat placing table 39. At least one of the first arm 36 and the second arm 37 may be configured to transfer the boat 14 between the boat cooling position "a" and the wafer transfer position "b", and the other one of the first arm 36 and the second arm 37 may be configured to further move backward in a direction away from the boat loading/unloading position "c" from its own standby position. According to the embodiments, for example, the second arm 37 may be rotated to the wafer transfer position "b".

In FIGS. 4 and 5, the boats 14 are illustrated for convenience as if the boat 14 is placed at all of the boat cooling position "a", the wafer transfer position "b" and the boat loading/unloading position "c". However, actually, the boat 14 may be placed at two positions (or placed at one position when the boat 14 is loaded into the process furnace 2) among the boat cooling position "a", the wafer transfer position "b" and the boat loading/unloading position "c". That is, the two boats 14 can be accommodated in the loading chamber 12 at the same time.

The boat exchanging device 31 is operated as described below. In advance, the two boats 14 without accommodating the wafers are placed on the boat placing table 38 and the boat placing table 39, respectively. The wafers including the wafer 5 transported out of the pod 6 and aligned by a notch aligner (not shown) are transferred (charged) into the boat 14 placed on the boat placing table 39 (that is, at the wafer transfer position "b"). Then, the boat 14 at the wafer transfer position "b" charged with the aligned wafers therein is transferred to the boat loading/unloading position "c" by the first arm 36.

Then, the boat 14 transferred to the boat loading/unloading position "c" is loaded into the process chamber 18 by the boat elevator 16, and the predetermined processing is performed to the wafers. While the wafers are processed in the process chamber 18, the boat 14 without accommodating the wafers at the boat cooling position "a" is transferred to the wafer transfer position "b" by the second arm 37. Then, other wafers before performing a notch alignment are transported out of the pod 6, aligned by a notch aligner (not shown), and transferred into the boat 14 to fill the boat 14 with the above-mentioned other wafers.

After the predetermined processing in the process chamber 18 is completed, the boat 14 charged with the processed wafers including the wafer 5 therein is unloaded out of the process chamber 18, and lowered to the boat loading/unloading position "c". Then the boat 14 is transferred to the boat cooling position "a" by the second arm 37. The processed wafers are cooled while the boat 14 is at the boat cooling position "a".

While the processed wafers are being cooled, the boat 14 charged with aligned wafers therein and placed at the wafer transfer position "b" is transferred to the boat loading/unloading position "c" by the first arm 36, and loaded into the process chamber 18. Then, the predetermined processing is performed to the wafers.

While the predetermined processing is performed in the process chamber 18, the boat 14 cooled at the boat cooling position "a" is transferred to the wafer transfer position "b" by the second arm 37. Then the processed wafers including the wafer 5 are transported out of the boat 14, and transferred into the pod 6.

When the boat 14 is empty by transporting the processed wafers out of the boat 14, other wafers before performing the notch alignment are transported out of the pod 6, aligned by the notch aligner (not shown), and transferred into the boat 14 to fill the boat 14 with the unprocessed wafers. By repeatedly performing the operations described above, the unprocessed wafers are sequentially subjected to the predetermined processing, and the processed wafers are sequentially transported out of the loading chamber 12. The wafers may be transported into or out of the boat 14 while the boat 14 is at a position other than the wafer transfer position "b". For example, the wafers may be transported into or out of the boat 14 while the boat 14 is at the boat loading/unloading position "c".

Subsequently, the first clean air supply mechanism 32, the second clean air supply mechanism 33 and the third clean air supply mechanism 34 will be described.

The first clean air supply mechanism 32 is provided along the first side surface facing the second side surface described above, and faces the boat loading/unloading position "c" closely. The third clean air supply mechanism 34 is provided along the first side surface and adjacent to the first clean air supply mechanism 32, and faces the wafer transfer position "b" closely. The second clean air supply mechanism 33 is provided at a corner between a side surface (back surface) facing the front surface and the first side surface. In addition, since an end portion of the second clean air supply mechanism 33 facing the back surface is spaced farther from the first side surface, the second clean air supply mechanism 33 faces the boat cooling position "a" closely, and also faces the boat loading/unloading position "c".

The first clean air supply mechanism 32 extends in a longitudinal direction (vertical direction) of the boat 14 in the loading chamber 12. A lower end of the first clean air supply mechanism 32 is located above each of the rotation shafts of the first arm 36 and the second arm 37, and an upper end of the first clean air supply mechanism 32 is located near the ceiling of the loading chamber 12. For example, the first clean air supply mechanism 32 is constituted by: a first fan mechanism 42 including a first axial fan; a first outlet 43 extending over the entire length of the first fan mechanism 42 in parallel with the longitudinal direction of the boat 14; and a first buffer region 44 provided between the first fan mechanism 42 and the first outlet 43.

As shown in FIGS. 3 and 4, for example, the first fan mechanism 42 is constituted by a first fan mechanism 42a and a first fan mechanism 42b, which are stacked in the vertical direction. The first fan mechanism 42a includes a first axial fan 41a, and the first fan mechanism 42b includes a first axial fan 41b. A first filter 431 for preventing dusts is provided at the first outlet 43 over the entire length of the first outlet 43. That is, the first filter 431 is provided at a downstream side of each of the first axial fan 41a and the first axial fan 41b, and the first buffer region 44 is provided between the first axial fans 41a and 41b and the first filter 431. According to the embodiments, one axial fan is provided for each of the first fan mechanism 42a and the first fan mechanism 42b. However, two or more axial fans may be provided for each of the first fan mechanism 42a and the first fan mechanism 42b.

The second clean air supply mechanism 33 extends in the longitudinal direction (vertical direction) of the boat 14 in the loading chamber 12. An upper end of the second clean air supply mechanism 33 is located near the ceiling of the loading chamber 12, and a lower end of the second clean air supply mechanism 33 is located lower than the lower end of the first clean air supply mechanism 32 and lower than an upper end of the device body 30. For example, the second clean air supply mechanism 33 is constituted by: a second fan mechanism 46 including a second axial fan, a second outlet 47 extending over the entire length of the boat 14 in parallel with the longitudinal direction of the boat 14; and a second buffer region 48 provided between the second fan mechanism 46 and the second outlet 47.

As shown in FIGS. 3 and 4, for example, the second fan mechanism 46 is constituted by a second fan mechanism 46a and a second fan mechanism 46b, which are stacked in the vertical direction. The second fan mechanism 46a includes a second axial fan 45a and a second axial fan 45b that are vertically adjacent to each other, and the second fan mechanism 46b includes a second axial fan 45c and a second axial fan 45d that are vertically adjacent to each other.

A vertical length of the second outlet 47 and a vertical length of a third outlet 52 are longer than a length of the first clean air supply mechanism 32. A lower end of each of the second outlet 47 and the third outlet 52 are located lower than the upper end of the boat exchanging device 31 and higher than positions of the first arm 36 and the second arm 37 when the arms 36 and 37 are elevated. A second filter 471 for preventing dusts is provided at the second outlet 47 over the entire length of the second outlet 47. That is, the second filter 471 is provided at a downstream side of each of the second axial fans 45a through 45d, and the second buffer region 48 is provided between the second axial fans 45a through 45d and the second filter 471. In addition, when there is no risk of contact with the second arm 37, the lower end of the second outlet 47 may be extended to near the floor of the loading chamber 12.

The third clean air supply mechanism 34 extends in the longitudinal direction (vertical direction) of the boat 14 in the loading chamber 12. An upper end of the third clean air supply mechanism 34 is located near the ceiling of the loading chamber 12, and a lower end of the third clean air supply mechanism 34 is located lower than the lower end of the first clean air supply mechanism 32. For example, the third clean air supply mechanism 34 is constituted by: a third fan mechanism 51 including a third axial fan; the third outlet 52 extending over the entire length of the boat 14 in parallel with the longitudinal direction of the boat 14; and a third buffer region 53 provided between the third fan mechanism 51 and the third outlet 52.

As shown in FIGS. 3 and 4, for example, the third fan mechanism 51 is constituted by a third fan mechanism 51a and a third fan mechanism 51b, which are stacked in the vertical direction. The third fan mechanism 51a includes a third axial fan 49a, and the third fan mechanism 51b includes a third axial fan 49b. A third filter 521 for preventing dusts is provided at the third outlet 52 over the entire length of the third outlet 52. That is, the third filter 521 is provided at a downstream side of each of the third axial fan 49a and the third axial fan 49b, and the third buffer region 53 is provided between the third axial fans 49a and 49b and the third filter 521. According to the embodiments, one axial fan is provided for each of the third fan mechanism 51a and the third fan mechanism 51b. However, two or more axial fans may be provided for each of the third fan mechanism 51a and the third fan mechanism 51b.

The first fan mechanisms 42a and 42b, the second fan mechanisms 46a and 46b and the third fan mechanisms 51a and 51b are connected to the PLC 40, respectively. The PLC 40 serving as an flow volume controller is configured to control a rotation speed or an flow volume (that is, an amount of the clean air) of each of the first axial fans 41a and 41b, the second axial fans 45a through 45d and the third axial fans 49a and 49b arbitrarily.

A main intake duct 54 through which the clean air flows is provided between the first side surface and the first clean air supply mechanism 32 and between the first side surface and the third clean air supply mechanism 34. The first clean air supply mechanism 32 and the third clean air supply mechanism 34 are directly connected to the main intake duct 54. That is, the first clean air supply mechanism 32 and the third clean air supply mechanism 34 have a common clean air supply source. The clean air flowing through the main intake duct 54 is ejected from the first clean air supply mechanism 32 toward the boat loading/unloading position "c" (that is, in a first direction), and ejected from the third clean air supply mechanism 34 toward the wafer transfer position "b" (that is, in a third direction).

An intake region 55 is provided between the second clean air supply mechanism 33 and the corner. That is, the intake region 55 is provided in a space defined by the second clean air supply mechanism 33, the first side surface and the back surface. An auxiliary intake duct 56 through which the clean air flows is provided below a bottom surface of the loading chamber 12, and the intake region 55 is connected to the auxiliary intake duct 56 such that the intake region 55 is communicable with the auxiliary intake duct 56.

An auxiliary duct 57 is provided between the first clean air supply mechanism 32 and the second clean air supply mechanism 33. The auxiliary duct 57 extends from the first buffer region 44 along a side surface of the first clean air supply mechanism 32 toward the first side surface of the loading chamber 12, and extends along the first side surface toward the intake region 55. That is, the auxiliary duct 57 defines a flow path bent in a crank shape that communicates with the first buffer region 44 and the intake region 55. That is, the second clean air supply mechanism 33 is configured to suck the clean air at the first buffer region 44 and an intake side (that is, the intake region 55) of the second axial fans 45a through 45d via the auxiliary duct 57. In addition, a damper 58 as a valve for adjusting the flow volume may be provided at a connection portion between the auxiliary duct 57 and the first buffer region 44. The damper 58 could be operated by fixing an opening degree thereof manually after adjusting the opening degree. Alternatively, by providing an electric drive mechanism, the damper 58 may be configured such that the opening degree can be adjusted via the PLC 40.

Thus, the clean air is supplied from the auxiliary intake duct 56 to the intake region 55, and at the same time, the clean air is supplied from the first buffer region 44 to the intake region 55 via the auxiliary duct 57. The clean air supplied to the intake region 55 is ejected from the second clean air supply mechanism 33 toward the boat cooling position "a" (in the second direction). The boat 14 at the boat loading/unloading position "c" is on an extension line connecting the second clean air supply mechanism 33 and the boat cooling position "a". Therefore, the clean air ejected in the second direction flows over the boat cooling position "a" and the boat loading/unloading position "c".

An exhaust cover 59 is provided on the second side surface of the loading chamber 12 so as to extend toward a center of the loading chamber 12. The exhaust cover 59 extends over the entire length in the vertical direction from the floor of the loading chamber 12 to the ceiling of the loading chamber 12. An elevation shaft 61 of the substrate transport device 13, an elevation shaft 62 of the boat 14 and an exhaust duct 63 serving as an exhaust mechanism are located between the exhaust cover 59 and the second side surface. That is, the elevation shaft 61 of the substrate transport device 13 is provided along the second side surface. The exhaust duct 63 extends in the vertical direction such that the clean air sucked through a hole on a side surface can flow downward or upward. In addition, an exhaust port 64 with a predetermined width is provided along the vertical direction at a position of the exhaust cover 59 facing the boat loading/unloading position "c". When the boat 14 is elevated or lowered, an arm 65 of the boat 14 moves in the exhaust port 64.

The elevation shaft 61 of the substrate transport device 13 and the elevation shaft 62 of the boat 14 (that is, the elevation shaft 62 the boat elevator 16) are incompletely covered by the exhaust cover 59. Thus, the main intake duct 54 and a space inside the exhaust cover 59 communicate with each other through the first axial fans 41a and 41b, the third axial fans 49a and 49b and the exhaust port 64. In addition, the auxiliary intake duct 56 and the space inside the exhaust cover 59 communicate with each other through the second axial fans 45a through 45d and the exhaust port 64.

An end portion at an upstream end of the main intake duct 54 is open near the floor of the loading chamber 12. An electric damper 60 is provided in the middle of the main intake duct 54. An opening degree of the electric damper 60 can be controlled. The clean air ejected from the first clean air supply mechanism 32, the second clean air supply mechanism 33 and the third clean air supply mechanism 34 passes through the boat cooling position "a", the wafer transfer position "b" and the boat loading/unloading position "c". Then, part of the clean air flows into the main intake duct 54, and another part of the clean air flows into the exhaust duct 63 through the exhaust port 64 and the exhaust cover 59. The clean air flowed into the exhaust duct 63 is temporarily exhausted outside the loading chamber 12 by an exhaust fan (not shown).

The clean air exhausted from the loading chamber 12 may flow through a space around the process furnace 2 and may be discharged to the outside of the substrate processing apparatus 1. Alternatively, the clean air exhausted from the loading chamber 12 may be supplied again as the clean air via the auxiliary intake duct 56 and may be ejected from the third clean air supply mechanism 34. The main intake duct 54 includes a flow path configured to supply the clean air from the outside.

Before describing a formation of an air flow in the loading chamber 12 according to the embodiments, a formation of an air flow according to comparative examples will be described.

Figure 6A:
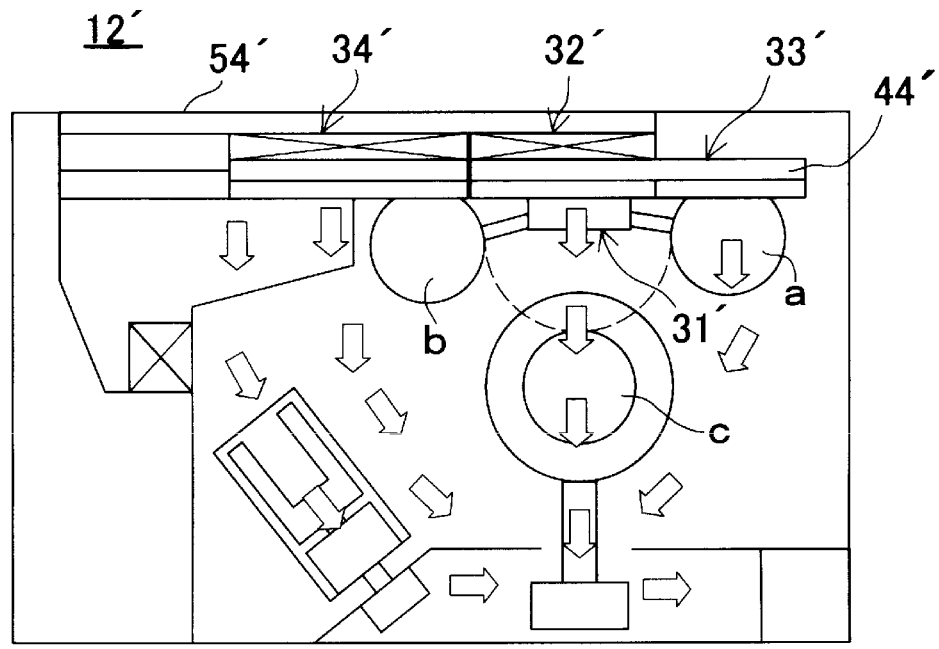
FIG. 6A is a plan view schematically illustrating a loading chamber of the substrate processing apparatus according to a comparative example.

FIG. 6A schematically illustrates a loading chamber 12' according to a comparative example when viewed from above. In FIG. 6A, the formation of the air flow according to the comparative example is schematically illustrated. Referring to FIG. 6A, three clean air supply mechanisms 32',33' and 34' are provided along the first side surface of the loading chamber 12'. According to the loading chamber 12' with the configuration shown in FIG. 6A, the fan mechanism cannot be provided in the second clean air supply mechanism 33' in order to avoid the interference with a boat exchanging device 31'. Therefore, by enlarging a first buffer region 44' and by making the first buffer region 44' as a common buffer region of the first clean air supply mechanism 32' and the second clean air supply mechanism 33', it is possible to secure an area of the airflow.

Figure 6B:
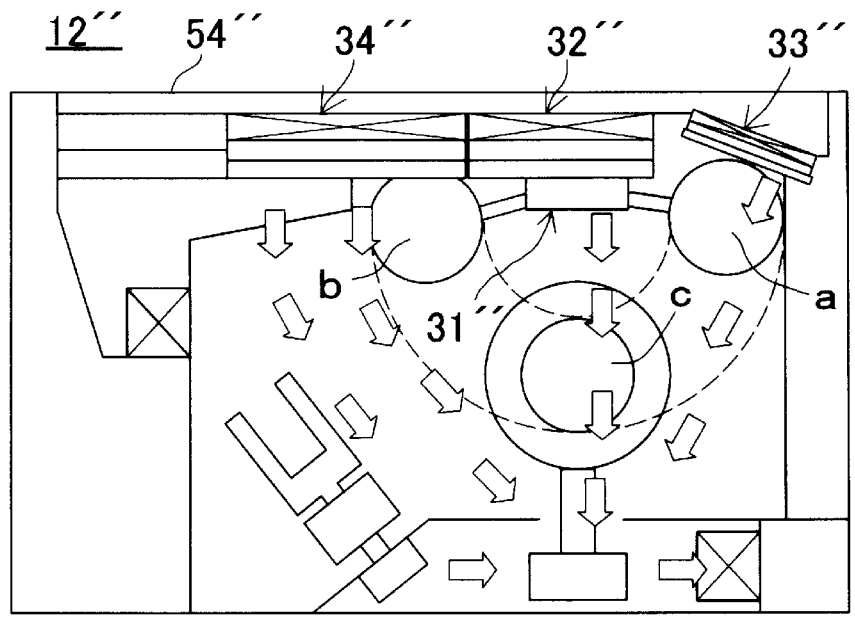
FIG. 6B is a plan view schematically illustrating a loading chamber of the substrate processing apparatus according to another comparative example.

FIG. 6B schematically illustrates a loading chamber 12" according to another comparative example when viewed from above. A second clean air supply mechanism 33" is provided so as to be inclined at a corner between the first side surface and the back surface such that the clean air can be ejected toward a center of the loading chamber 12". According to the loading chamber 12" with the configuration shown in FIG. 6B, by tilting the second clean air supply mechanism 33", it is possible to secure a space for installing the fan mechanism. A first clean air supply mechanism 32", the second clean air supply mechanism 33" and a third clean air supply mechanism 34" are all configured to eject the clean air supplied from a main intake duct 54".

In both the loading chamber 12' and the loading chamber 12", the clean air ejected through each of the clean air supply mechanisms flows through a main intake duct 54' or the main intake duct 54". Therefore, the required intake amount of the clean air is not achieved, and it is particularly difficult to secure the flow volume of the clean air ejected from the second clean air supply mechanism 33' or the second clean air supply mechanism 33". Therefore, the turbulence in the air flow may easily occur, and in particular, the clean air may easily stagnate at the boat cooling position "a" and around the boat cooling position "a" in the loading chamber 12' or the loading chamber 12".

In addition, since each fan mechanism of each clean air supply mechanism does not have an flow volume adjustment function and ejects the clean air at a constant flow volume while the predetermined processing is being performed, it is difficult to deal with a defect caused by the air flow such as generation of particles occurs.

In addition, according to the loading chamber 12' or the loading chamber 12", a shape of each the clean air supply mechanism is limited so as to avoid the interference with the boat exchanging device 31' or a boat exchanging device 31". As a result, the air flow may not be formed reliably near a boat elevator 16' or a boat elevator 16". Therefore, the wafers may be cooled non-uniformly, and the throughput may be reduced due to a variation in the quality of the substrate processing.

In order to address the situations described above, by providing the second clean air supply mechanism 33 at the corner between the first side surface and the back surface to secure a space for installing the second fan mechanisms 46a and 46b and by supplying the clean air to the second clean air supply mechanism 33 not only from the main intake duct 54 but also from the auxiliary intake duct 56, the disclosers of the present application have confirmed that it is possible to secure the flow volume of the clean air supplied into the loading chamber 12. In addition, the disclosers of the present application have confirmed that it is possible to optimize the formation of the air flow of the clean air by individually controlling the axial fans by the PLC 40.

Hereinafter, referring to FIG. 7, the air flow (that is, the flow of the clean air) formed in the loading chamber 12 according to the embodiments will be described.

Figure 7:
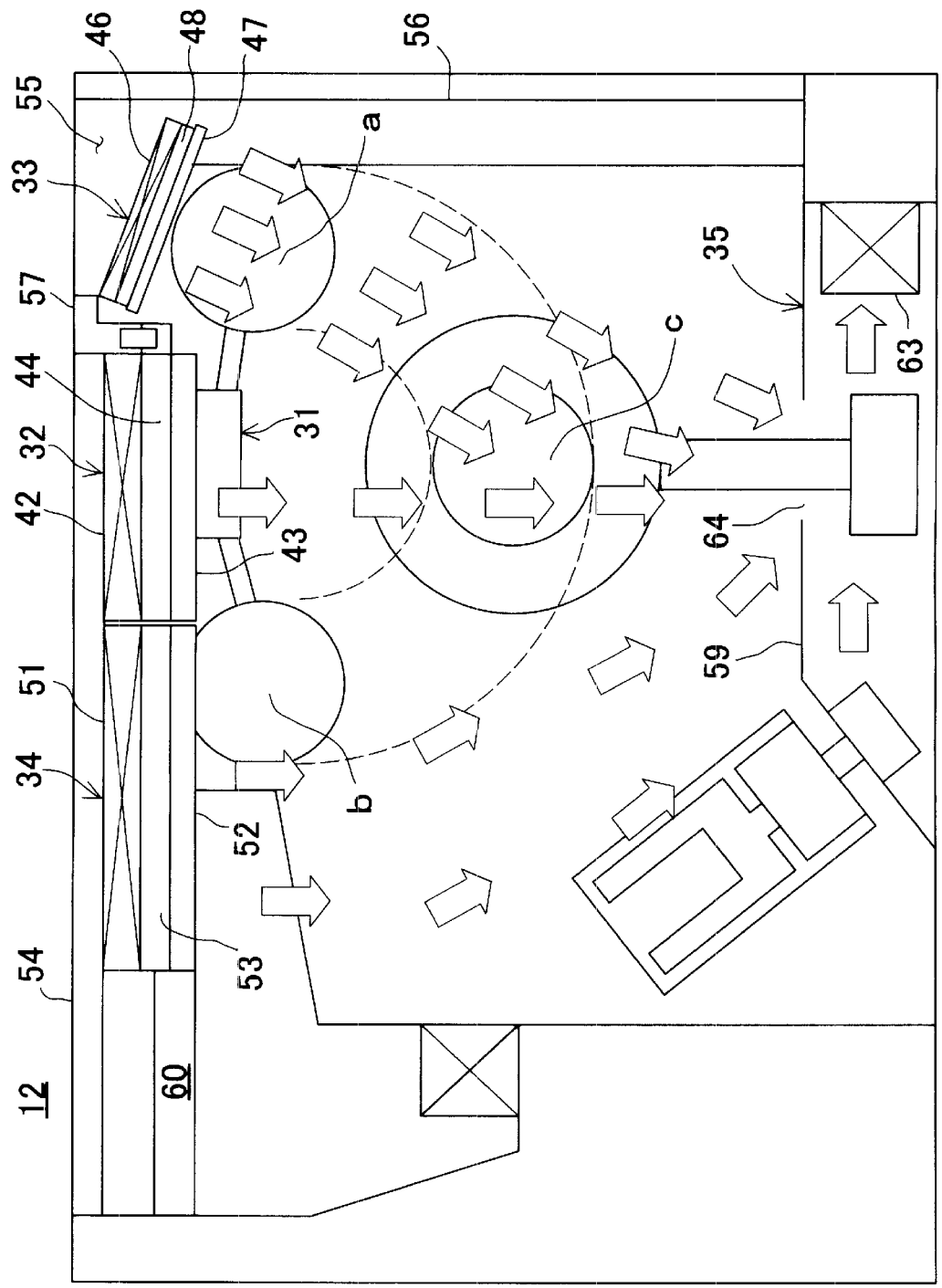
FIG. 7 schematically illustrates an air flow of clean air according to the embodiments described herein.

As shown in FIG. 7, the clean air ejected from the first clean air supply mechanism 32 forms the air flow on the boat elevator 16, and the clean air ejected from the third clean air supply mechanism 34 forms the air flow on the wafer transfer position "b". By providing the second clean air supply mechanism 33 so as to be inclined at the corner, it is possible to reliably form the airflow on the boat cooling position "a" by the clean air ejected from the second clean air supply mechanism 33.

The clean air whose air flow is formed at each of the boat cooling position "a", the wafer transfer position "b" and the boat loading/unloading position "c" flows into the exhaust cover 59 through the exhaust port 64, and is exhausted to the outside the loading chamber 12 through the exhaust duct 63.

FIGS. 8A, 8B, 9A through 9D schematically illustrate wind speed distributions at predetermined heights in the loading chamber 12' according to the comparative example and in the loading chamber 12 according to the embodiments. Each of the predetermined heights shown in FIGS. 8A and 8B represent a height based on a position of boat 14 when the boat 14 is placed at the boat cooling position "a", the wafer transfer position "b", and the boat loading/unloading position "c".

FIG. 8A schematically illustrates wind speed distributions in the loading chamber 12' according to the comparative example. Specifically, in FIG. 8A, the wind speed distribution of a heat insulating plate region corresponding to a height at which the heat insulating portion 14a is provided, the wind speed distribution of a bottom region (indicate by "BTM REGION" in FIG. 8A) corresponding to a height at which a lowermost wafer among the wafers is loaded (charged) and the wind speed distribution of a center region (indicate by "CTR REGION" in FIG. 8A) corresponding to a height near the center of the boat 14 are illustrated. FIG. 8B schematically illustrates wind speed distributions in the loading chamber 12 according to the embodiments. Specifically, in FIG. 8B, the wind speed distribution of a heat insulating plate region according to the embodiments, the wind speed distribution of a bottom region according to the embodiments and the wind speed distribution of a center region according to the embodiments are illustrated.

Comparing the wind speed distributions shown in FIGS. 8A and 8B, in the loading chamber 12' according to the comparative example, at each of the predetermined heights described above, it can be seen that the flow volume of the clean air is small (that is, the wind speed is slow) at the boat cooling position "a" and its periphery, and the clean air stagnates along the back surface of the loading chamber 12'. In addition, it can be seen that the flow volume at the boat loading/unloading position "c" is small (that is, the wind speed is slow) in the bottom region and the heat insulating plate region, that is, in a lower portion of the loading chamber 12'.

However, in the loading chamber 12 according to the embodiments, at each of the predetermined heights described above, in particular, at the boat cooling position "a", it can be seen that the wind speed of the clean air is maintained at a predetermined value or higher, and the stagnation of the clean air is eliminated. In addition, in the vicinity of a wall surface such as the back surface, when a wind speed gradient (shear speed) across an axis perpendicular to the wall surface is greater than a predetermined value, no stagnation of the clean air occurs.

Figure 9A:
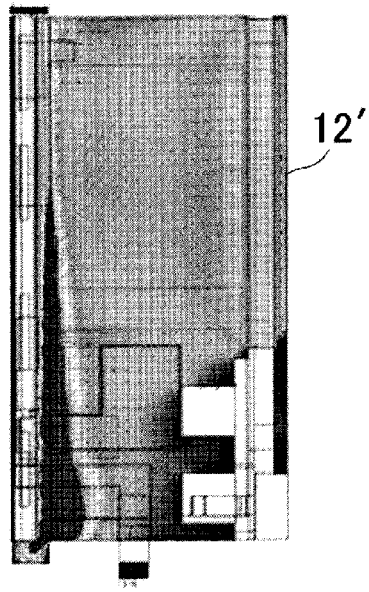
FIG. 9A schematically illustrates a portion taken along the line A-A of FIG. 8A, FIG. 9B schematically illustrates a portion taken along the line A-A of FIG. 8B, FIG. 9C schematically illustrates a portion taken along the line B-B of FIG. 8A, and FIG. 9D schematically illustrates a portion taken along the line B-B of FIG. 8B.
Figure 9B:
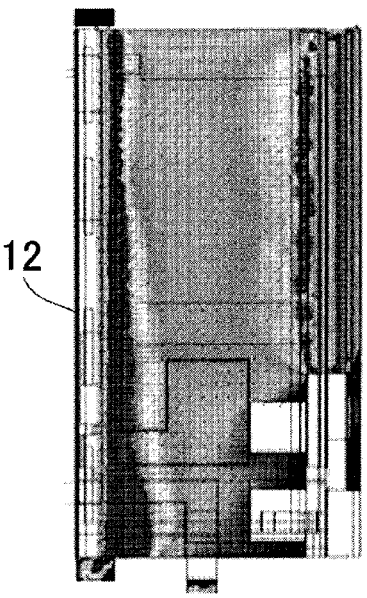
Figure 9C:
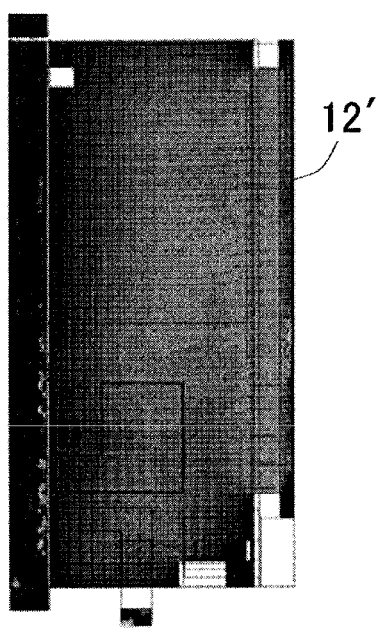

FIG. 9A schematically illustrates a portion taken along the line A-A of FIG. 8A at the boat loading/unloading position "c" of the loading chamber 12', FIG. 9B schematically illustrates a portion taken along the line A-A of FIG. 8B at the boat loading/unloading position "c" of the loading chamber 12, FIG. 9C schematically illustrates a portion taken along the line B-B of FIG. 8A at the boat cooling position "a" of the loading chamber 12', and FIG. 9C schematically illustrates a portion taken along the line B-B of FIG. 8B at the boat cooling position "a" of the loading chamber 12.

Figure 9D:
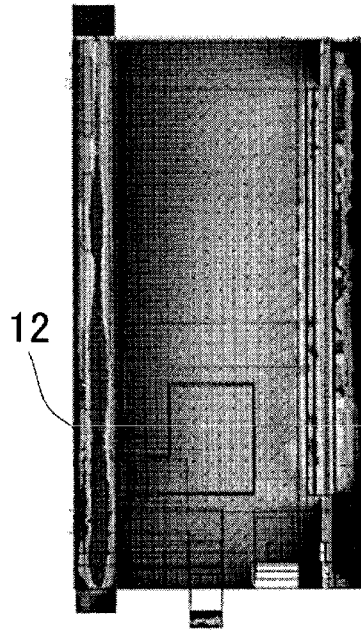

As shown in FIGS. 9A and 9B, in each of the loading chamber 12' according to the comparative example and the loading chamber 12 according to the embodiments, it can be seen that the air flow of the clean air is improved over the entire length, in particular, at a lower portion of each of the loading chamber 12' and the loading chamber 12 in the vicinity of the boat loading/unloading position "c" and the second side surface, and the stagnation of the clean air near the boat exchanging device 31 is eliminated. In addition, as shown in FIGS. 9C and 9D, in each of the loading chamber 12' according to the comparative example and the loading chamber 12 according to the embodiments, it can be seen that the air flow of the clean air is greatly improved over the entire length in a height direction, in particular, at the boat cooling position "a" and its periphery.

As described above, according to the embodiments, each of the clean air flowing through the main intake duct 54 through the auxiliary duct 57 and the clean air flowing through the auxiliary intake duct 56 can be supplied into the intake region 55 of the second clean air supply mechanism 33. Therefore, it is possible to eliminate the shortage of the flow volume of the second clean air supply mechanism 33, which has been particularly insufficient according to the comparative example.

In addition, by eliminating the shortage of the flow volume, it is possible to reliably form the air flow of the clean air and to suppress the stagnation of the clean air over the entire length at the boat cooling position "a" and the boat loading/unloading position "c" where the stand-by time is long. Therefore, for example, even when the wafer 5 transferred out of the inside of the process chamber 18 generates heat, it is possible to suppress the generation of the particles by suppressing the stagnation of the clean air. As a result, it is possible to avoid the contamination of the wafer 5 with the particles.

According to the embodiments, the air flow of the clean air can be reliably formed over the entire length at the boat cooling position "a" where the wafers including the wafer 5 need to be cooled. Therefore, it is possible to reliably supply the clean air sufficient for cooling the wafers when the wafers are cooled at the boat cooling position "a", and to shorten the time required to cool the wafers.

According to the embodiments, each of the axial fans can be individually controlled by the PLC 40. As a result, for example, at the boat cooling position "a", it is possible to uniformly form the air flow the entire length in the height direction. Therefore, it is possible to uniformly cool the wafers including the wafer 5 loaded in the boat 14, and to improve the throughput since the variation in the quality can be reduced.

By controlling the axial fans individually by the PLC 40, it is possible to control the flow volume of the clean air ejected from each of the clean air supply mechanisms, and to optimize the balance of the flow volume.

In addition, even when the defect due to the air flow occurs, by controlling the axial fans individually by the PLC 40 and by finely adjusting the air flow, it is possible to easily deal with the defect.

It is also possible to control the axial fans individually not only for reliably forming the air flow but also for forming the air flow at a required location for each process.

For example, when the boat 14 does not exist at the boat cooling position "a", the wafer transfer position "b" or the boat loading/unloading position "c", the ejection of the clean air from the corresponding clean air supply mechanism may be stopped or reduced. Alternatively, the flow volume of the clean air ejected from the second clean air supply mechanism 33 may be increased when the wafers including the wafer 5 are required to be cooled at the wafer transfer position "b".

Specifically, each of the axial fans may be controlled so that the flow volume of the clean air is stopped or reduced when the boat 14 no longer faces the first clean air supply mechanism 32 as the boat elevator 16 is elevated or lowered.

In addition, when the boat 14 unloaded out of the process chamber 18 is transferred to the boat cooling position "a", each of the axial fans may be controlled so that the flow volume of the clean air ejected from the second clean air supply mechanism 33 is increased as a temperature of the wafer 5 is increased. Usually, a temperature of a wafer on an upper portion of the boat 14 among the wafers is higher than that of a wafer on the lower portion of the boat 14 among the wafers.

As described above, by controlling each of the axial fans for each process to adjust the flow volume of the clean air, it is possible to optimize the formation of the air flow (or to optimize the balance of the flow volume), and to save power.

According to some embodiments in the present disclosure, it is possible to suppress the generation of the particles and to improve the throughput.

What is claimed is:

1. A substrate processing apparatus comprising:
    a loading chamber communicating with a process chamber where a substrate is processed and capable of accommodating a boat, the boat being configured respectively to support a plurality of substrates;
    an elevator configured to elevate and lower the boat between the process chamber and the loading chamber;
    a boat exchanging device configured to move the boat unloaded out of the process chamber and placed on the elevator to a first stand-by region and a second stand-by region;
    a first clean air supplier configured to eject clean air in a first direction and facing an unloading region in the loading chamber where the boat placed on the elevator is accommodated;
    a second clean air supplier configured to eject the clean air in a second direction and facing the first stand-by region;
    a third clean air supplier configured to eject the clean air in a third direction and facing the second stand-by region;
    a substrate transport device provided in the loading chamber and whose elevation shaft is provided along a second side surface of the loading chamber;
    an exhaust cover provided in the loading chamber and configured to incompletely cover the elevation shaft of the substrate transport device and an elevation shaft of the elevator; and
    a main intake duct configured to connect a space between the second side surface and the exhaust cover to intake sides of the first clean air supplier and the third clean air supplier such that the space and the intake sides are in communication with each other;
    wherein a flow volume of the clean air ejected from each of the first clean air supplier, the second clean air supplier and the third clean air supplier is individually controlled so as to form a predetermined air flow in a range of height in which the boat exchanging device in the loading chamber is provided.

2. The substrate processing apparatus of claim 1, wherein the loading chamber comprises a substantially rectangular internal space, a substrate loading/unloading port is provided on a front surface of the loading chamber, the first clean air supplier and the third clean air supplier are provided along a first side surface of the loading chamber, the second clean air supplier is provided at a corner between the first side surface and a back surface of the loading chamber, the elevator is provided along the second side surface facing the first side surface, and the boat exchanging device are provided below the first clean air supplier close to the first side surface.

3. The substrate processing apparatus of claim 1, wherein each of the first clean air supplier, the second clean air supplier and the third clean air supplier comprises an outlet extending in parallel with a longitudinal direction of the boat, and a length of the outlet of the second clean air supplier and a length of the outlet of the third clean air supplier are longer than a length of the outlet of the first clean air supplier.

4. The substrate processing apparatus of claim 1, wherein the first clean air supplier comprises: a first axial fan configured to eject the clean air in the first direction; a first filter provided at a downstream side of the first axial fan; and a first buffer region provided between the first axial fan and the first filter,
    the second clean air supplier comprises: a second axial fan configured to eject the clean air in the second direction; a second filter provided at a downstream side of the second axial fan; and a second buffer region provided between the second axial fan and the second filter,
    the third clean air supplier comprises: a third axial fan configured to eject the clean air in the third direction; a third filter provided at a downstream side of the third axial fan; and a third buffer region provided between the third axial fan and the third filter, and
    the second clean air supplier is configured to suck the clean air at the first buffer region and an intake side of the second axial fan through a duct defining a flow path bent in a crank shape and connecting the first buffer region and the intake side of the second axial fan.

5. The substrate processing apparatus of claim 4, wherein the duct comprises a damper.

6. The substrate processing apparatus of claim 1, further comprising:
    an auxiliary intake duct independent from the main intake duct and configured to connect the space between the second side surface and the exhaust cover to an intake side of the second clean air supplier such that the space and the intake side of the second clean air supplier is in communication with each other.

7. The substrate processing apparatus of claim 1, wherein the first stand-by region and the unloading region is provided along the second direction, and the second clean air supplier is configured to compensate for a shortage of the flow volume of the clean air supplied through the first clean air supplier in the unloading region.

8. The substrate processing apparatus of claim 7, wherein each of the first clean air supplier, the second clean air supplier and the third clean air supplier comprises an outlet extending in parallel with a longitudinal direction of the boat, and a length of the outlet of the second clean air supplier and a length of the outlet of the third clean air supplier are longer than a length of the outlet of the first clean air supplier.

9. A substrate processing apparatus comprising:
    a loading chamber communicating with a process chamber where a substrate is processed and capable of accommodating a boat, the boat is configured to support a plurality of substrates;
    an elevator configured to elevate and lower the boat between the process chamber and the loading chamber;
    a boat exchanging device configured to move the boat unloaded out of the process chamber and placed on the elevator to a first stand-by region and a second stand-by region;

a first clean air supplier configured to eject clean air in a first direction and facing an unloading region in the loading chamber where the boat placed on the elevator is accommodated;
a second clean air supplier configured to eject the clean air in a second direction and facing the first stand-by region; and
a third clean air supplier configured to eject the clean air in a third direction and facing the second stand-by region,
wherein the first clean air supplier comprises: a first axial fan configured to eject the clean air in the first direction; a first filter provided at a downstream side of the first axial fan; and a first buffer region provided between the first axial fan and the first filter,
the second clean air supplier comprises: a second axial fan configured to eject the clean air in the second direction; a second filter provided at a downstream side of the second axial fan; and a second buffer region provided between the second axial fan and the second filter,
the third clean air supplier comprises: a third axial fan configured to eject the clean air in the third direction; a third filter provided at a downstream side of the third axial fan; and a third buffer region provided between the third axial fan and the third filter, and
the second clean air supplier is configured to suck the clean air at the first buffer region and an intake side of the second axial fan through a duct defining a flow path bent in a crank shape and connecting the first buffer region and the intake side of the second axial fan, and
wherein at least one of the first clean air supplier, the second clean air supplier and the third clean air supplier forms a predetermined air flow in a range of height in which the boat exchanging device in the loading chamber is provided.

10. The substrate processing apparatus of claim 9, wherein the duct comprises a damper.

11. A method of manufacturing a semiconductor device comprising:
(a) loading a boat supporting a substrate into a process chamber from a loading chamber communicating with the process chamber and capable of accommodating a boat and processing the substrate in the process chamber; and
(b) unloading the boat out of the process chamber after the substrate is processed,
wherein, in (b), while the boat is lowered from the process chamber to an unloading region by an elevator and thereafter the boat is transferred from the unloading region to an empty one among a first stand-by region and a second stand-by region by a boat exchanging device, a flow volume of clean air ejected in a first direction from a first clean air supplier facing the unloading region, a flow volume of the clean air ejected in a second direction from a second clean air supplier facing the first stand-by region and a flow volume of the clean air ejected in a third direction from a third clean air supplier facing the second stand-by region are individually controlled so as to form a predetermined air flow in a range of height in which the boat exchanging device in the loading chamber is provided, and
wherein a substrate transport device is provided in the loading chamber and an elevation shaft of the substrate transport device is provided along a second side surface of the loading chamber, an exhaust cover is provided in the loading chamber and is configured to incompletely cover the elevation shaft of the substrate transport device and an elevation shaft of the elevator, and a main intake duct connects a space between the second side surface and the exhaust cover to intake sides of the first clean air supplier and the third clean air supplier such that the space and the intake sides are in communication with each other.

* * * * *